(12) United States Patent
Seppä et al.

(10) Patent No.: US 9,011,762 B2
(45) Date of Patent: Apr. 21, 2015

(54) METHOD FOR MANUFACTURING CONDUCTORS AND SEMICONDUCTORS

(75) Inventors: Heikki Seppä, Helsinki (FI); Mark Allen, Espoo (FI)

(73) Assignee: Valtion Teknillinen Tutkimuskeskus, Espoo (FI)

( * ) Notice: Subject to any disclaimer, the term of this patent is extended or adjusted under 35 U.S.C. 154(b) by 1225 days.

(21) Appl. No.: 12/374,179

(22) PCT Filed: Jul. 5, 2007

(86) PCT No.: PCT/FI2007/050416
§ 371 (c)(1), (2), (4) Date: Apr. 8, 2009

(87) PCT Pub. No.: WO2008/009779
PCT Pub. Date: Jan. 24, 2008

(65) Prior Publication Data
US 2009/0301769 A1 Dec. 10, 2009

Related U.S. Application Data

(60) Provisional application No. 60/832,144, filed on Jul. 21, 2006.

(51) Int. Cl.
*B22F 7/00* (2006.01)
*B22F 1/02* (2006.01)
(Continued)

(52) U.S. Cl.
CPC *H05K 3/321* (2013.01); *B22F 1/02* (2013.01); *B22F 7/04* (2013.01); *B22F 2203/11* (2013.01);
(Continued)

(58) Field of Classification Search
USPC ............ 365/96; 419/9; 257/E23.018
IPC ............... B22F 1/0018,3/105, 1/0062
See application file for complete search history.

(56) References Cited

U.S. PATENT DOCUMENTS

| 6,239,538 B1 | 5/2001 | Konuma |
| 2004/0033679 A1 | 2/2004 | Jacobson et al. |

(Continued)

FOREIGN PATENT DOCUMENTS

| JP | H02292801 A | 12/1990 |
| JP | H08264268 A | 10/1996 |

(Continued)

OTHER PUBLICATIONS

Sankaran Sivaramakrishnan, National University of Singapore, Nature Materials, vol. 6 (Feb. 2007), pp. 149-155.

(Continued)

*Primary Examiner* — Weiping Zhu
(74) *Attorney, Agent, or Firm* — Birch, Stewart, Kolasch & Birch, LLP

(57) ABSTRACT

The invention relates to a sintering method for manufacturing structures by sintering. In addition, the invention relates to a sintered product, an electronic module, and new uses. In the method, a particle material containing conductive or semiconductive encapsulated nanoparticles is sintered, in order to increase its electrical conductivity, by applying a voltage over the particle material. In the method, a substrate is typically used, one surface of which is at least partly equipped with a layer containing nanoparticles. The method is based on thermal feedback between the voltage feed and the nanoparticles. The invention permits the manufacture of conductive and semiconductive structures and pieces by sintering at room temperature and at normal pressure.

38 Claims, 4 Drawing Sheets

Figure 1:
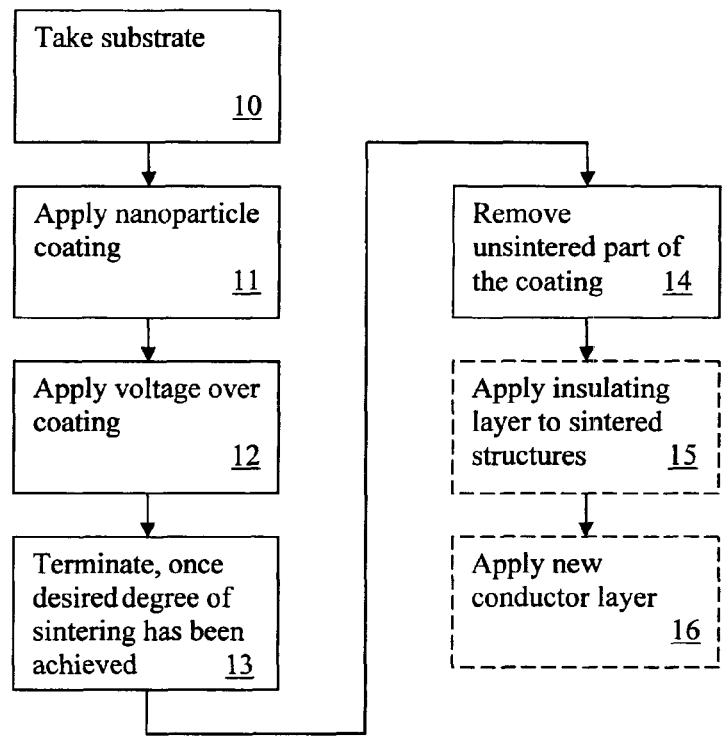

(51) Int. Cl.
    *H05K 3/12*     (2006.01)
    *H05K 3/32*     (2006.01)
    *B22F 7/04*     (2006.01)

(52) U.S. Cl.
    CPC ........... *B22F 2999/00* (2013.01); *H05K 3/1283* (2013.01); *H05K 2201/0257* (2013.01); *H05K 2203/105* (2013.01); *H05K 2203/1115* (2013.01); *H05K 2203/1131* (2013.01)

(56) References Cited

U.S. PATENT DOCUMENTS

| | | | |
|---|---|---|---|
| 2004/0085797 A1* | 5/2004 | Mei et al. | 365/96 |
| 2005/0136638 A1 | 6/2005 | Voss-Kehl et al. | |
| 2005/0207930 A1 | 9/2005 | Yamaguchi | |
| 2005/0238804 A1 | 10/2005 | Garbar et al. | |
| 2007/0099345 A1 | 5/2007 | Bauer et al. | |

FOREIGN PATENT DOCUMENTS

| | | |
|---|---|---|
| JP | 10-209582 A | 8/1998 |
| JP | H117830 A | 1/1999 |
| JP | H1180647 A | 3/1999 |
| JP | H1196892 A | 4/1999 |
| JP | H11279604 A | 10/1999 |
| JP | 2000-348717 A | 12/2000 |
| JP | 2002-093855 A | 3/2002 |
| JP | 2002-299833 A | 10/2002 |
| JP | 2003-171185 A | 6/2003 |
| JP | 2004-039846 A | 2/2004 |
| JP | 2004-119686 A | 4/2004 |
| JP | 2004-119790 A | 4/2004 |
| JP | 2004-247572 A | 9/2004 |
| JP | 2004-273205 A | 9/2004 |
| JP | 2006-022394 A | 1/2006 |
| JP | 2006-26602 A | 2/2006 |
| JP | 2006-100371 A | 4/2006 |
| WO | WO-2004/075211 A1 | 9/2004 |
| WO | WO-2004/103043 A1 | 11/2004 |
| WO | WO-2005/025787 A1 | 3/2005 |
| WO | WO-2005/060008 A1 | 6/2005 |
| WO | WO-2005/061598 A1 | 7/2005 |
| WO | WO-2005/104226 A2 | 11/2005 |
| WO | WO-2006/011180 A1 | 2/2006 |
| WO | WO-2006/076603 A2 | 7/2006 |
| WO | WO-2007/004033 A2 | 1/2007 |

OTHER PUBLICATIONS

Japanese Appeal Action issued in Japanese Patent Application No. 2009-520002 on Jun. 24, 2014.

Japanese Office Action issued in Japanese Patent Application No. 2013-166793 on Aug. 19, 2014.

\* cited by examiner

METHOD FOR MANUFACTURING CONDUCTORS AND SEMICONDUCTORS

This application is a National Phase of PCT/FI2007/050416 filed on Jul. 5, 2007, which claims priority under 35 U.S.C. 119(e) to U.S. Provisional Application No. 60/832,144, filed on Jul. 21, 2006, all of which are hereby expressly incorporated by reference into the present application.

The present invention relates to sintering and products manufactured by sintering. In particular, the invention relates to the creation of conducting structures on a substrate by sintering metallic nanoparticles, or nanoparticles that are formed of semiconductors.

As is known, metal nanoparticles are sintered to create, for example, conductor structures in printable electronic applications. It is known that metallic nanoparticles melt at lower temperatures than micro-level particles, due to the so-called 'surface-phonon softening' phenomenon. This is because the number of 'loose' atoms on the surface of a particle increases significantly as the total size of the particle decreases. The phenomenon is known reasonably well, both theoretically and experimentally, even though some aspects of the phenomenon are still unexplained. In the literature, there is no exhaustive explanation, for example, of the fact that, when nanoparticles are covered with a thin layer of an organic compound and brought with the aid of solvents to the surface of a substrate, it will be observed that the sintering temperature can be considerably lower than that predicted by the melting temperature of individual particles.

Even though the sintering temperature of nanoparticles is indeed substantially lower than that of microparticles, in known solutions external heating is required to sinter them too.

Sintering is achieved with the aid of a raised temperature in an oven or by subjecting the particles to UV light or a hot plate or roller. The temperatures required are generally at least 100° C. Only very small semiconductor particles can be sintered at low temperatures, but even then the performance values of the sintered structures will remain poor. Heating limits the choice of the substrates used in connection with the methods. Several plastic or paper substrates, which would be advantageous in terms of their price, change their shape or disintegrate at the temperatures required in sintering. Indeed, in the field there is a strong trend towards producing sintering methods and sinterable material compositions, which would be suitable for use at low temperatures. Some such known methods are disclosed in, for instance, WO publications 2005/061598 and 2004/075211.

The invention is intended to create an entirely new type of method for sintering nanoparticles, which is suitable for use at very low temperatures, even at room temperature, and at normal pressure.

The invention is also intended to create a new electronic product and a new electronic module.

The invention is based on the observation that a voltage (electrical field) arranged over encapsulated nanoparticles will initiate sintering already at low temperatures. Thus, in the method according to the invention, a particle material containing conductive or semiconductive encapsulated nanoparticles is sintered, in order to increase its electrical conductivity, by connecting a voltage over the particle material.

The method is typically implemented in such a way that a substrate is used, the surface of which is at least partly equipped with a layer containing nanoparticles, which contains conductive or semiconductive nanoparticles. The nanoparticles contained in the layer are sintered by connecting a voltage over the layer. The voltage gives rise to a tunnelling current through the layer, which creates sintering of the particles in a new manner, which is described in detail later. Thus individual, for example, metallic nanoparticles can be used to form a uniformly conducting metallic conductor pattern or conductor layer between the voltage electrodes.

The product according to the invention comprises a substrate and a conductor or semiconductor pattern formed by sintering from nanoparticles arranged on the surface of the substrate. The pattern is sintered with the aid of a voltage, which is led to the layer containing the encapsulated conductor or semiconductor nanoparticles. The sintered pattern is characterized by being of high quality and highly homogeneous, because the sintering progresses systematically from the centre point of the voltage electrodes towards the electrodes, and not randomly from here and there.

The electronic module according to the invention comprises at least one electric circuit, which in its initial state has specific electrical properties and a specific functionality. The module also comprises at least one zone containing nanoparticles, to which voltage can be led in order to at least partly sinter the zone. When it is being sintered, the zone is arranged to connect electrically at least two conductor areas contained in the electric circuit, in order to alter the electrical properties or the functionality of the electric circuit.

The invention arose, when a test arrangement was made, in which unsintered dried silver nanoparticles were placed at room temperature in a gap formed between two electrodes made from metal, in order to understand the sintering of nanoparticles and to measure the possible predicted electrical non-linearities. As expected, it was observed that the unsintered structure was slightly conductive. When using an electrode gap of about 100 μm and a voltage of about five volts (current <1 mA), the conductivity increased rapidly and the final result was a structure with a conductivity corresponding to that of a conductor made by sintering at a temperature of more than 100° C. After the voltage was removed, the structure remained conductive in all the tests that were made. An approximately doubling of the electrode gap resulted in a need to also double the voltage led to the sintering. A more detailed examination showed the silver to have almost entirely sintered in the process.

Thus the invention is particularly suitable for such particles in which this phenomenon is observed to be sufficiently powerful. Particles of this kind are particularly metallic conductor and semiconductor particles, which are of a mean size in which the smallest dimension is less than 100 nm, and the encapsulation of which is thin. Thus many such particles, which are also generally used in traditional sintering applications, are suitable for use in connection with the present invention. Their size is 1-100 nm, typically 1-50 nm.

The nanoparticles are typically brought to the surface of the substrate in an encapsulated form (as agglomerates). They can be brought to the substrate as a dispersion or suspension, along with a liquid or paste-like carrier, but they can also be spread as a powder. Solvents, inks, and polymer dispersions are typically used as the carrier. The most usual application techniques are forms of printing. However, the invention is not limited to some specific application method or particle powder or paste composition, though particular advantages can be obtained in connection with some methods. We use the term particle material to refer generally to materials with a nanoparticle content, in which the particle density is sufficient to start their mutual sintering (coalescence).

We have observed an embodiment to be particularly effective, in which a voltage from an impedance that is lower than the resistance of a conductive film made by tunnelling, is set over a film that has been made from nanoparticles and dried.

In this case, the film sinters from the centre towards the electrodes. If, in addition, a resistance is placed in series with the voltage source, or the voltage control is terminated shortly after the sintering starts (for example, on the basis of a timer or impedance measurement), the metal particles of the film can be partly sintered. This will permit the manufacture of extremely thin lines. The series resistance causes the voltage source to change into a current source as the sintering progresses, so that the process is made effectively self-regulating. The essential feature of this is that, at a desired stage in the sintering, the power received by the particle material drops to less than the power required for the sintering to progress.

More specifically, the method according to the invention is characterized by what is stated in the characterizing portion of Claim 1.

The electronic product according to the invention is characterized by what is stated in the characterizing portion of Claim 27.

The electronic module according to the invention is characterized by what is stated in the characterizing portion of Claim 32.

Considerable advantages are gained with the aid of the invention. With its aid, the complete sintering of metal particles is achieved already at room temperature, without an external heat source. After the voltage has been connected, the temperature in the centre of the electrodes generally rises to sintering temperature in a few seconds and actual sintering starts within a few milliseconds. In other words, the sintering is very rapid compared to traditional methods and produces no heat in the substrate. Thus conductive patterns can be created in a substrate irrespective of the heat tolerance of the substrate. The sintering temperature of semiconductor nanoparticles is generally higher than that of metallic particles, but even in their case the sintering temperature can be considerably reduced.

Thus, in the case of metallic and semiconductor particles suitable for sintering created by an electric field (hereinafter also electrical sintering or electro-sintering), the use of the method can reduce the sintering temperature by at least tens, typically by several hundred degrees. For example, sintering 7-nm silver particles will take place already at room temperature.

Because in sintering there is no need for mechanical contact with the mass being sintered, the roughness or lack of homogeneity of the substrate is also not a problem, as it generally is in the case of methods performed under pressure. This means that the method is also more suitable than known methods for sintering three-dimensional conductive patterns.

Because the method is based on an electric field, it permits not only sintering, but also the construction of patterns. The method is particularly suitable for manufacturing thin line widths, for example, in applications relating to circuit-board electronics, printed electronics, and component manufacture. The method can also be used to make contacts and metallic vias in components.

We have observed that the temperature of the nanoparticle layer rises as the particles fuse. Because the increase in the temperature of the nanoparticle layer is entirely caused by the electric field, dielectric substrates do not experience a corresponding heating. In addition, as the mass of the layers is very small, only an insignificantly small amount of heat is transferred to the substrate. Thus, the method is suitable for substrates that significantly change their physical or chemical properties (shrink, disintegrate, bent, change colour, etc.) at an increase temperature and/or pressure. Such substrates are many typical plastics and papers. Sintering according to the invention is indeed preferably performed at a temperature of less than 100° C., especially preferably at a temperature of 0-50° C. According to the embodiment that is regarded as best, electro-sintering is performed at room temperature, thus making nearly all substrates with a surface that need only be sufficiently smooth to receive a unified nanoparticle layer, suitable bases.

The method can be used in entirely new applications, or it can be used in known applications, in which either the voltage and/or the nanoparticle layer is naturally available.

Examples of applications include manufacturing programmable memory, manufacturing overvoltage protectors, passivizing theft detectors, for example, on shop counters, changing an RFID antenna from remote reading to close reading, high-resolution patterning a metal in printed electronics applications, for example, making a conductor that is invisible, or nearly invisible to the naked eye, e.g., on a printed display.

The processing of small patterns is simple with the aid of the method, because as the sintering is controlled by an electric field, the resolution level of the patterns need not be achieved mechanically.

In the following, various embodiments of the invention are examined in greater detail with reference to the accompanying drawings.

Figure 2:
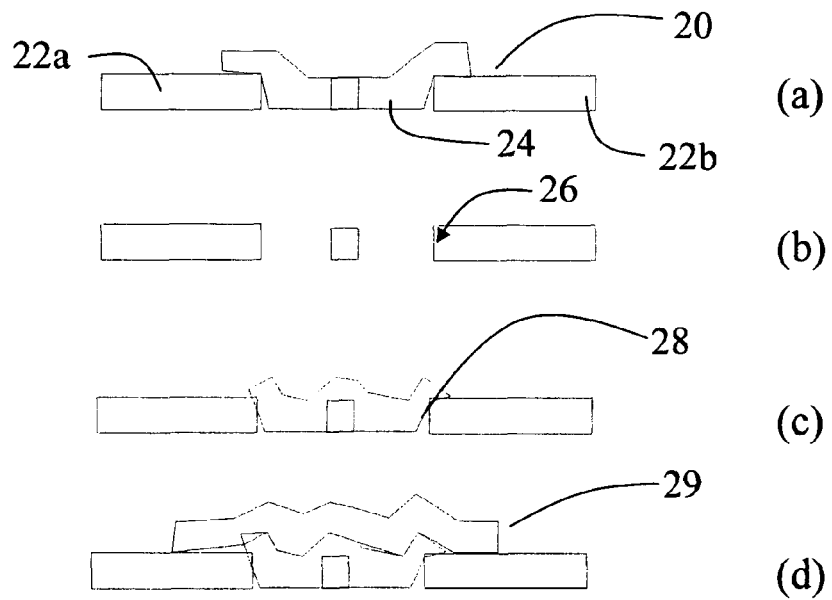
Figure 3:
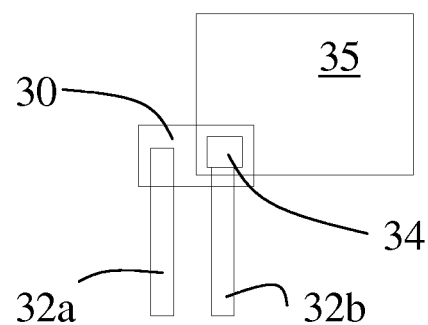
Figure 4A:
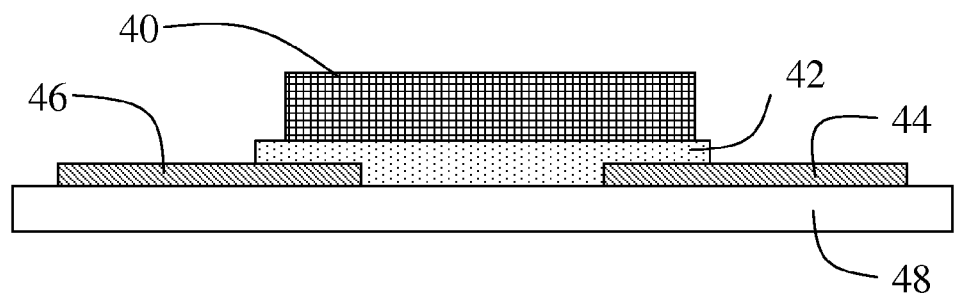
Figure 4B:
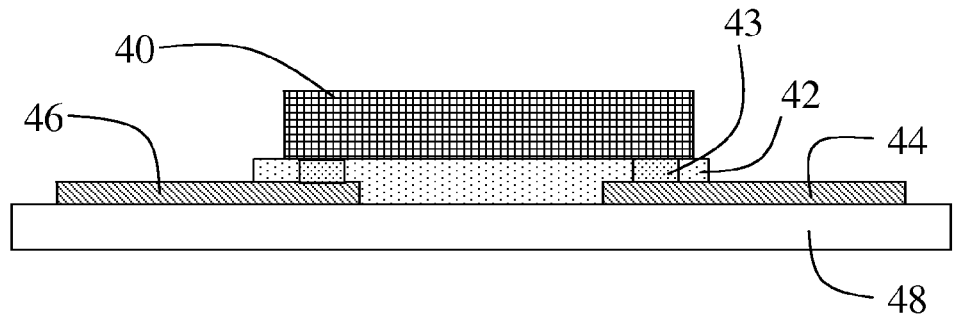
Figure 4C:
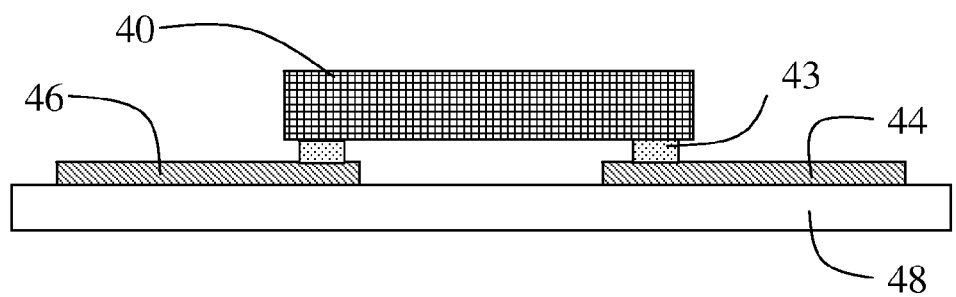
Figure 5:
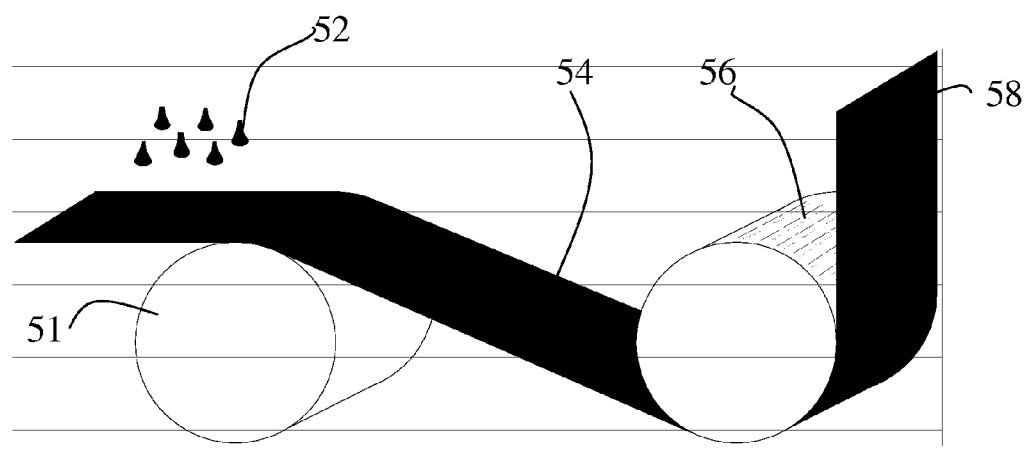

FIG. 1 shows a flow diagram of one form of implementation of the method,

FIG. 2 shows a side cross-section of one possible process for manufacturing a transistor, utilizing electrical sintering, FIG. 3 shows a top view of the manufacture of an electrical contact with the aid of electro-sintering, FIGS. 4*a*-4*c* show side cross-sections of the manufacture of an electrical contact with the aid of electro-sintering, and FIG. 5 shows a perspective view one an apparatus according to one embodiment, for sintering a pattern on the surface of a web-like substrate.

In order to understand the present invention, the following is a brief description of the physical phenomenon that can be detected in the surface of a substrate, when a voltage is arranged over the nanoparticle layer.

It is known that, when nanoparticles are three-dimensionally in a surface, the surface can conduct electricity, if its thermic energy $k_B T$ is greater than and/or of the same order as the so-called charging energy $e^2/C$, in which e is the electron charge and C the capacitance between two particles. According to this, the electrical conductivity of the layer should be extremely poor at low temperatures. In addition, the so-called Casimir's force acts between the particles, and effectively reduces the charging energy and creates a situation, in which such a group consisting of small charged particles can conduct current by tunnelling already at relatively low temperatures.

The following chain of inference presents one way of modelling a sintering event achieved with the aid of voltage, when using a sintering layer containing nanoparticles encapsulated with a polymer shell:

As the layer has poor electrical conductivity, the thermal conductivity of the layer will also be poor. (However, it must be noted that, to initiate the phenomenon, both the electrical and thermal conductivities must deviate substantially from zero.)

As the voltage increases, the layer tends to heat up (poor thermal conductivity).

Because the electrical conductivity is based on thermal excitation, the electrical conductivity of the layer will improve as the temperature rises. In addition, the powerful electric field will increase the conductivity of the surface, because the voltage partly cancels the so-called Coulomb blockade.

The ability of the layer to draw power from an external voltage source increases ($P=U^2/R$).

This accelerates the increase in temperature in the centre of the layer (in the direction between the electrodes).

When the central part reaches a critical temperature, the particles' polymer sheath melts and the particles come closer to each other.

The tunnel current between adjacent particles increases while thermal conductivity simultaneously improves.

When a few nanoparticles melt onto each other, their effective total surface area increases and they release their heat through an electron gas to the other particles.

The particles close to the melted nanoparticles also melt and metallization progresses from the centre towards the voltage electrodes. If the event is allowed to continue, the entire layer between the electrodes will sinter.

It will be observed from the above example of the chain of events that, with the aid of the invention, the positive feedback between the inbuilt electrical conductivity of dense nanoparticle systems and the increase in temperature can be utilized to achieve sintering. Thus, sintering can be advantageously controlled using a constant voltage instead of a constant current. Extremely little power will be required to implement the method, because the system is thermally isolated and because the positive feedback allows heating to take place extremely rapidly. In addition, as nanoparticles have a low specific heat and a small mass, a small amount of heat will easily increase their temperature.

Electrical sintering is basically a complicated phenomenon. The phenomenon is described above only to an extent that will permit the reader to understand and repeat the method according to the invention and its embodiments. Thus, in the method heat is not brought directly to the system, as it is in known sintering methods, but instead sintering is performed using a voltage that leads to a positive thermic feedback and thus to rapid sintering. An interesting feature of the method is the increasing sintering speed after sintering starts. In addition, the sintered structures created are of good quality, i.e. durable and with homogenous conductivity.

If, instead of voltage biasing, the system is controlled using current biasing, or over a large resistance, the positive feedback can be prevented and sintering will not take place (at least as easily). If the value of the resistance is suitable, or the voltage is cut off at a specific moment, the event can be adjusted to be such that only the centre part of the electrodes sinters and the other parts will remain unmetallized. This permits the processing of conductors that are clearly smaller than the gaps between the electrodes. We have observed that it is possible to achieve a line width that is at most ⅕, and even ⅒ of the distance between the electrodes. Naturally, this is also affected by the size of the nanoparticles. For example, when using 10-nm particles and a 50-μm electrode gap, conductors of less than 5 μm can be made. Using even smaller particles, conductors even considerably smaller than this can be made. A narrower electrode gap will also permit the manufacture of thinner conductors.

In connection with the invention, it is possible to use both metallic nanoparticles and semiconductor nanoparticles. Examples of areas of applications in both cases are described later in greater detail. Suitable metals are particularly silver, gold, copper, platinum, nickel, palladium, iron, titanium, tin, and alloys of these. In the case of semiconductors, reference can be made particularly to silicon, germanium, titanium, zinc, GaAs, and indium-based semiconductors. Oxide semiconductors can also be used, especially titanium dioxide and zinc oxide.

The encapsulation layer of the nanoparticles is preferably thin, so that a sufficient (one that initiates sintering) tunnelling current will be achieved at the operating temperature. We use the term thin encapsulation to refer primarily to an encapsulation-layer thickness that is less than 30%, typically less than 1-20% of the diameter of the agglomerate. The thickness of the encapsulation is typically about 1-5 nm. Typically organic compounds, such as polymers, are used as the encapsulation material. The softening temperature of the encapsulation material is preferably low, generally lower than or equal to the melting temperature of the nanoparticles, typically about 50-150° C. The essential factor is for the micro-level heating caused by the electro-sintering to permit adjacent nanoparticles to sinter together (coalesce).

The encapsulation of the particles is clearly linked to the success of electro-sintering. According to a preferred embodiment, the nanoparticles being sintered are coated, i.e., encapsulated, with a polymer sheath (e.g. PEO, PPO), which prevents clustering of the particles prior to their being placed on the substrate. This is important, for example, in inkjet printing, in which particles that adhere to each in the printer would block the nozzles. In addition to application, corresponding encapsulation is also of benefit in the actual sintering event. Particles that are not encapsulated will adhere to each other partly already before the 'forced' sintering, in which case the stored energy of the material would be considerably less than in the case of particles that are clearly separate. Such a material will be brittle and conduct electricity very poorly, nor will it be able to be sintered in a corresponding manner, as part of the energy (potential) stored in the material will have discharged.

In summary, it can be stated that the method is thus based on the initial heating of the particle material due to the effect of the power it takes from the voltage source and further to the increasing power consumption caused by the heating, and thus, at least in the initial stage of the sintering event, to accelerating sintering. Highly suitable basic materials are sufficiently dense particle materials containing encapsulated nano-scale particles that possess electrical and thermal conductivities that are weak, but nevertheless deviate from zero. Thus, after the voltage has been connected, a local increase in temperature will be observed in the layer, which will in turn cause the sintering event to spread in the particle material, essentially in the direction of the electric field.

Nanoparticles can be introduced to the substrate dispersed in a solvent, for example, as an ink (so-called nano-ink), when a very even particle distribution will be achieved. Such an application method has the advantage that it can be implemented with the aid of inkjet type printing. Other nanoparticle application methods are, for example, imprinting, roller spreading, spraying, painting, and electrostatic transfer. Application does not form an essential procedure stage in the present method, because nano-inks and similar retain their sinterability for a long time after application. Thus application and sintering are not temporally or locally connected to each other.

One known method for introducing nanoparticles to the surface of a substrate is disclosed in WO publication 2005/025787. The particles are in a liquid dispersion, which can be printed, for example, using the traditional inkjet method. During spraying, the solvent evaporates from the dispersion, so that its viscosity increases.

FIG. 1 shows one possible embodiment of the method according to the invention. In stage 10, a substrate is taken, on the surface of which it is wished to make a conductive pattern. The substrate can be, for example, paper, board, a polymer film, a three-dimensional plastic piece, a circuit board, a ceramic base, glass, or some other corresponding insulating material. When permanent patterns are manufactured, a substrate is selected, which is able to bind the applied and sintered nanoparticle surfacing to its surface. The substrate can also be temporary, in which case the sintered will not adhere to it and can be transferred from the substrate to some other substrate.

In stage 11, the nanoparticles are applied to the substrate, for example, with the aid of dispersion, as described above. When using solvents or pastes, the coating is preferably allowed to dry on the surface of the substrate so that the nanoparticle concentration will increase to a level suitable for sintering. This means that the nanoparticles are able, when they melt, to joint to each other and thus to form uniformly conductive chains or areas.

In stage 12, an electric field is created through the surfacing by arranging a voltage over it. The voltage can be created on the surface of the substrate, using electrodes that are ready on the application area of the nanoparticles, or alternatively using electrodes, which are introduced afterwards into the vicinity of the surface. Of course, it is also possible to operate in such a way that one of the electrodes are ready on the surface, essentially in contact with the surface, and the other electrodes in introduced to the surface afterwards (for example, the manufacture of contacts). The magnitude of the voltage depends on the distance between the electrodes and the desired sintering speed and resolution. A typical sintering voltage with a 100-µm electrode gap is 1-10 V, preferably about 5-8 V. The electrode gap typically varies in the range 10 µm-5 nm, being preferably 10 µm-1 nm.

In stage 13, the sintering is terminated. This can take place in different ways. Firstly, sintering ends automatically, if the entire surfacing layer has been sintered. If conductor particles are used, the sintered layers will short circuit the electrode circuit. Secondly, the voltage can be disconnected a specific time after it has been switched on. The switching can also be based on a feedback field. After the voltage has been switched off, the sintering stops and the temperature of the layer returns to normal. Thirdly, the voltage-feed circuit can be designed in such a way that when a sufficiently large area of the surfacing has been sintered, the sintering stops. This can be achieved simply, for example, with the aid of a resistance connected in series with a constant-voltage source. The power consumption of the sintered part then increases to a specific level as the resistance of the surfacing diminishes, and the input power will no longer be sufficient to cause more sintering.

In stage 14, the unsintered material can be removed from the substrate mechanically, chemically, or in other ways.

The method can be further continued with the aid of stages 15 and 16. In these, a thin insulating layer is applied on top of the conductor pattern (stage 15), after which the manufacture of the product is continued by applying a second conductor or semiconductor layer (stage 16). In this way multi-layer semiconductor component structures, circuit boards, or even entire functional electronic modules can be manufactured. Thus the method described is particularly suitable for printed electronics applications.

We have observed an embodiment to be particularly effective, in which the voltage is connected over the layer containing nanoparticles essentially parallel to the surface of the substrate, with the aid of electrodes arranged in contact with the layer and set on opposite sides of the layer laterally parallel to the surface. The electrodes can be part of the conductors that remain in the structure, or of conductors introduced to the substrate in a manner that allows them to be removed later.

To achieve sintering in the present method, there is no need for an external heat source or compression, instead the increase in temperature created by the voltage fed to the layer has been observed to be sufficient, due to the structure's internal positive feedback described earlier. To ensure that the temperature of the substrate will not rise considerably, it is preferable to use a substrate, which has a thermal capacity in the sintering area is substantially greater than the thermal capacity in the area to be sintered. Such a substrate should thus withstand only the external temperature, which can be, for example −50-100° C., preferably about 10-40° C., typically normal room temperature.

The method can also be implemented in steps, so that, in the following stage of the method, the conductor structure sintered in the previous stage is used as an electrode in the following stage. For example, sintering of extensive surfaces can be implemented by using the finished conductors to sinter the surface between them. For example, when making dense conductor patterns or conductor grids, the pattern can be made denser by continually applying a new nanoparticle layer and connecting the voltage to the previously sintered layers. In the first stage, there are (two) area electrodes, in the following stage the first (one) sintered conductor is introduced between them, in the next stage (two) new sintered conductors are made between each area electrode and the first sintered conductor, in the next stage a further four new sintered lines, and so on.

The following is a description of some practical applications of the invention.

EXAMPLE APPLICATION 1

Sintering Metallic Surfaces and Patterned Metal Structures at Low Temperatures

As described above, the most natural way to exploit the method disclosed is to sinter metal at a low temperature by introducing a powerful electric field to the surface, either galvanically or capacitively. If sintering is interrupted, extremely thin metal patterns can be made, for example, in the electronic transistor structures and diodes. A smaller line width will increase the speed of the transistor and diode. For example, a thin structure in a display will make it less visible.

FIG. 1 shows one way to make a transistor formed by a thin grid. In stage (a), ink 20 containing nanoparticles is printed between (and partly on top of) electrodes 22a and 22b on a substrate (not shown). Voltage is connected between the electrodes 22a and 22b, so that the central part 24 of the layer formed by the ink is sintered. In stage (b), the unsintered part of the layer is removed, so that an intermediate zone 26 remains between the electrodes and the sintered conductor 24. In stage (c), grid insulation 28 is printed in the sintering layer between the electrodes 22a and 22b. In stage (d), a semiconductor organic or inorganic layer 29 is further printed on top of the grid insulation and comes into contact with the electrodes 22a and 22b, but, thanks to the grid insulation 28, remains at a distance from the sintered conductor 24.

It is typical of the use of the method in component manufacture that at least one electrode arranged in the substrate is utilized, both as a sintering electrode in the manufacturing process and as a contact terminal in the finished component. The method has the particular advantage that the parts with the greatest effect on the speed of components, and that thus usually the smallest line width, can be manufactured without mechanical work. Particularly the three-stage (printing, partial sintering, removal of the unsintered part) method described above is suitable as a sub-process for the manufacture of printed electronics.

EXAMPLE APPLICATION 2

Sintering of Semiconductors at Low Temperatures

On the basis of experiments, semiconductors do not sintered at as low temperatures as metals. There is no general explanation for this, but we assume that it is due to the poor conductivity of the conductive surface and thus to a weak Casimir effect. Thus, when using traditional methods in sintering semiconductors at low temperatures, it is necessary to use very small particle sizes. This leads to a very large number of crystal faults and through it to poor mobility of charge carriers. With the aid of the present method, particle size can be increased. Thus electro-sintering can be used to achieve better mobility. In addition, if the particles are directed, for example, using a magnetic field before or during sintering, we can further reduced crystal faults and thus improve the mobility of the semiconductor created. Because the method requires the use of voltage electrodes, electrical sintering is particularly suitable for the manufacture of ready pre-processed semiconductors, or cases in which the industry using the semiconductors carries out the sintering.

EXAMPLE APPLICATION 3

Use of Metallic Nanoparticles in Attaching Electronic Components

The electronics industry is moving to lead-free soldering. It is known that nanoparticles can be used for attachment by sintering nano-ink onto the metal of the base and to the contact terminals of a component, using UV light or by heating.

FIG. 2 shows one way to exploit the present invention to manufacture a metallic contact, even at room temperature. In the method, an electric field is connected to a dried nanoparticle layer, in this case a nano-ink 30, which is located between a conductor 32b and a component 35, to make a contact 34. The conductor 32b also acts as the first voltage electrode. The electric field can be created by using a second electrode 32a, with which a contact with the nano-ink is also arranged. Alternatively, a contact terminal of the component 35 can be used as the second electrode, if the desired potential can be connected to it during the creation of the contact.

FIGS. 4a-4c show a side view of one way to make contacts. In FIG. 4a, conductors 44 and 46 are arranged on top of a substrate 48. Nanoparticles are printed on top of the conductors, to form a layer 42. The component 40 is placed on top of the layer 42, in such a way that its contact terminals area aligned with the conductors 44 and 46. In FIG. 4b, voltages are connected between the contact terminals of the component 40 and the conductors 44 and 46 (or alternatively between the conductors 44 and 46 and the second electrode/electrodes), in which case their intermediate area 43 sinters and forms a contact. In FIG. 4c, the unsintered layer has been removed.

EXAMPLE APPLICATION 4

Electrically Writable Memory

Memory is a central electronic component. In printed electronics, chargeable structures are used to make memory. Their weaknesses are, however, a low writing speed and poor permanence of the memory. Electrical sintering permits 0/1-type memory, which comprises resistance elements, which are nearly open without sintering (resistance, for example, 10 kOhm-100 kOhm) and voltage elements, which it is wished to bring to a short-circuit state, for sintering these resistance elements. We have observed that dried nano-ink, for example, retains its electrical sinterability for a long time, so that the memory can be written only after manufacture. In addition, the method permits the circuit's memory to be reset after use by sintering all the resistance elements.

More generally, a memory element writable with the aid of sintering comprises a matrix consisting of several units, in each of which unit there are two voltage electrodes and a zone containing nanoparticles, which when it is sintered is arranged to reduce the resistance between the voltage electrodes, preferably to short-circuit it. The voltage can be separately directed to the voltage electrodes of each unit of such a memory element, in order to create the described sintering.

EXAMPLE APPLICATION 5

Use in the Passivation of Theft Sensors or Remote-Identification Circuits

LC-resonance-type theft sensors are passivized by creating a powerful electric field over a thin insulation. This leads, for example, to aluminium particles travelling through a plastic insulation, when a short circuit is formed. However, this has the problem of the short circuit that has been made having a tendency to revert. This has led to theft-protection not being able to be introduced in so-called source-tagging applications, because the products would cause too many false alarms. The use of the present method eliminates the reactivation of theft sensors, because the sintered metal structure is highly stable.

In such a theft sensor, at least one unsintered or only partly sintered nanoparticle layer would thus be applied to a substrate, the layer when sintered being arranged to connect electrically two conductors contained in the theft sensor. The necessary sintering voltage or electric field can be led to the layer galvanically, capacitively, or inductively from outside the theft sensor. In order to create controlled sintering, separate sintering electrodes can be located in the vicinity of the nanoparticle layer. Alternatively, the sintering voltage can be arranged between conductors that are naturally in the device.

The EU is requiring all RFID circuits that may come into use by consumers to be able to be deactivated. UHF-range RFID circuits can also be used in theft protection. By using electrical sintering, we can use an electric field to short-circuit the antenna of the RFID circuit after purchase, and thus make the circuit unreadable. If the antenna is suitable short circuited, it is possible to arrange a situation, in which the UHF-RFID reading distance drops from several meters (for example, 4-6 meters) to a few centimeters (for example, 0-10 cm). Thus, after deactivation customers cannot be suspected of theft, nor can third parties obtain information from products they have purchased, but they can obtain services associated with the product, by reading within a close distance of the remote identifier in the product. The arrangement can also be made in such a way that the UHF antenna is destroyed, but the antenna forms, for example, a 13.56-MHz antenna, the consumer being able to use a suitable reader, for example a mobile telephone, connected to which, in order to obtain data from the circuit. Nowadays, some RFID circuits include the property that they can be made useless by programming, but this unfortunately prevents the consumer from being able to utilize the RFID circuits in products.

Stated more generally, the invention can be exploited for changing the operating frequency, sensitivity, or other properties of antennae, circuit boards, and other electronic devices (more generally: electronic modules). Such devices contain at least one zone with nanoparticles, which, when it is sintered, is arranged to reduce the impedance between two conductor areas of the device (generally to short-circuit them). The sintering voltage can be led to the zone, for example, as described above.

Alteration of the properties of an electronic module includes not only their passivation and changing their functionality, but also their activation. Thus, an electrical circuit contained in a module can be entirely useless in its initial state, but can be altered to become a functioning circuit with the aid of electro-sintering.

EXAMPLE APPLICATION 6

Roller Sintering

The method is well suited to mass production. An example of such an application is a form of implementation, in which the sintering voltage is connected over a particle-material layer by taking the substrate to the electric field in a web or sheet form. The electric field can consist of, for example, a patterned electrode means, which preferably comprises a rotating roller, and which contains means for connecting the voltage locally to the particle-material layer. Thus the surface of the electrode means is typically patterned with electrode zone and their counter-electrode zones. The sintering is then made using an electric field that is essentially parallel to the surface of the substrate and between the said electrodes.

The method thus permits the manufacture of sintered patterns using a set of simple, press-type means, for example, 'roll-to-roll' or 'roll-to-plane' type.

FIG. 5 shows in greater detail one form of implementation of roller sintering. The web 54 is transported with the aid of a set of rollers 51, 56. In the first stage, particle material 52 is applied to the surface of the web. After this, the web is led to an electrode roller 56, to the electrodes of which a sintering voltage is connected. The conductor pattern defined by the electrode geometry is thus reproduced on the web 54, when a conductor-patterned web 58 is created. The speed of movement of the substrate is selected to be such that the delay of the particle material in the electric field is sufficiently long to create complete sintering.

Roller sintering can also be implemented with the aid of a field at right angles to the surface of the substrate, especially if the resistance of the substrate does not excessively restrict the tunnelling current formed in the particle material. In this case, electrode means fitted to one surface and counter-electrode means fitted to the other side of the surface of this are generally used. At least one of the said electrode means comprises a conductor pattern for sintering a corresponding conductor pattern on the substrate. If the substrate itself is conductive, the substrate can be used as the counter electrode.

The electrode means can also be nips, through which the substrate must be transported. The electrode means need not, however, apply any considerable pressure or temperature on the substrate, as in known sintering applications, but instead the sintering take place preferable only with the aid of the voltage between the electrodes and the tunnelling current arising in the particle material. The method is also suitable for soft, porous, and brittle substrates.

As one versed in the art will understand from the above, a corresponding result can also be obtained with the aid of flat or other kinds of electrode means.

EXAMPLE APPLICATION 7

Making Vias

The method according to the invention is also suitable for making vias in the circuit board and component industries. Particular mention should be made of vias in single and multi-layer comprising surface-installation circuit boards and embedded components. Typically, a via hole (or recess) in a particle material in a fluid form, after which a sintering voltage is connected over the material, generally in the direction of the via.

The above examples of applications illustrate the wide industrial suitability of the invention. One skilled in the art will understand that the method described can also be used in many other application outside these examples. The accompanying Claims must be interpreted taking into account their full scope and equivalence interpretation.

The invention claimed is:

1. Sintering method, in which:
a particle material, containing conductive or semiconductive nanoparticles encapsulated by an encapsulation material, is sintered to join a plurality of said conductive or semiconductive nanoparticles-to each other, thereby increasing the electrical conductivity of said particle material, the method comprising:
arranging said encapsulated conductive or semiconductive nanoparticles in said particle material as a layer on an insulating substrate;
applying a voltage over the particle material containing said encapsulated conductive or semiconductive nanoparticles, such that said voltage creates an electric field that initiates a melting of said encapsulation material;
melting said encapsulation material between said conductive or semiconductive nanoparticles using said voltage, wherein said conductive or semiconductive nanoparticles come in contact with each other when their encapsulation material is melted; and
sintering together said conductive or semiconductive nanoparticles that are in contact with each other, using a positive thermal feedback and micro-level heating caused by said voltage, thereby forming a conductive material that has an electrical conductivity that is higher than the electrical conductivity of said particle material.

2. Method according to claim 1, wherein sintering is performed with the aid of voltage electrodes placed essentially on opposite sides of the particle material.

3. Method according to claim 1, wherein the voltage is created with the aid of a voltage source, the impedance of which is lower than the resistance of the particle material that is conductive by tunnelling at the moment at which the voltage is connected.

4. Method according to claim 1, wherein the voltage is connected with the aid of a constant-voltage source.

5. Method according to claim 1, wherein only a central part of the particle material is sintered.

6. Method according to claim 5, wherein the voltage is switched off once the sintering has progressed to a predefined level in the material.

7. Method according to claim 5, wherein the voltage is fed over a resistance, and wherein the magnitude of the resistance is arranged in such a way that once the power fed to the layer of nanoparticle material has increased due to sintering to a specific level, sintering stops.

8. Method according to claim 1, wherein sintering is performed at an external temperature of 0-100° C.

9. Method according to claim 8, wherein sintering is performed at an external temperature of 0-50° C.

10. Method according to claim 8, wherein sintering is performed at room temperature.

11. Method according to claim 1, wherein sintering is performed at normal pressure.

12. Method according to claim 1, wherein metallic nanoparticles or semiconductor nanoparticles are used.

13. Method according to claim 1, wherein nanoparticles encapsulated with an organic material are used.

14. Method according to claim 1, wherein nanoparticles are used, the diameter of which is on average 1-100 nm.

15. Method according to claim 14, wherein the diameter of the nanoparticles is less than 50 nm.

16. Method according to claim 14, wherein the diameter of the nanoparticles is less than 20 nm.

17. Method according to claim 1, wherein in order to initiate sintering, only the increase in the temperature of the layer containing nanoparticles, caused by the said voltage is utilized.

18. Method according to claim 1, wherein conductive or semiconductive structures are manufactured on said substrate, the surface of which is at least partly equipped with said layer of the said particle material.

19. Method according to claim 18, wherein the voltage is connected over the particle-material layer essentially parallel to the surface of the substrate.

20. Method according to claim 19, wherein the voltage is connected over the particle-material layer with the aid of electrodes placed laterally on the opposite side of the layer in the lateral direction of the layer arranged on the surface of the substrate.

21. Method according to claim 18, wherein the voltage is connected over the particle-material layer, at least partly in the direction normal to the surface of the substrate.

22. Method according to claim 18, wherein sintering is terminated before the entire particle-material layer is sintered, and the unsintered part of the particle-material layer is removed from the surface of the substrate.

23. Method according to claim 18, wherein a particle-material layer is used, the thermal capacity of which is substantially less than the thermal capacity of the substrate, in the area corresponding to the particle-material layer.

24. Method according to claim 18, wherein a particle-material layer is used, which comprises a layer dried from a liquid or paste-like dispersion.

25. Method according to claim 24, wherein the particle-material layer is an ink containing metal nanoparticles.

26. Method according to claim 18, wherein said substrate consists of a material, the chemical or physical properties of which change permanently at a temperature of more than 100° C.

27. Method according to claim 26, wherein said substrate is made of paper, board, or plastic.

28. Method according to claim 18, comprising a stage, in which a coating containing nanoparticles is applied to the surface of the substrate, in order to create said particle-material layer.

29. Method according to claim 18, wherein the sintering voltage is connected over the particle-material layer by bringing the substrate essentially into contact with an electrode portion for connecting the voltage locally to the particle-material layer.

30. Method according to claim 29, wherein the electrode portion comprises a rotating roller.

31. Method according to claim 1, wherein a printed electronic circuit, a semiconductor component, a via, or a contact for electrical component is manufactured.

32. Method according to claim 1, wherein one or more electrical properties of an electronic module is changed, the module comprising at least one zone containing nanoparticles, which when sintered is arranged to reduce the resistance between two conductor areas of the module.

33. Method according to claim 32, wherein the one or more electrical property is a frequency response or sensitivity of the electronic module.

34. Method according to claim 1, wherein said encapsulated nanoparticles are metallic conductor or semiconductor particles with organic encapsulation.

35. Method according to claim 34, wherein said organic encapsulation is a polymer sheath.

36. Method according to claim 1, wherein said sintering causes a micro-level heating by which adjacent nanoparticles coalesce.

37. Method according to claim 1, wherein said method sinters said particle material containing said conductive or semiconductive encapsulated nanoparticles, so that localized melting of said plurality of nanoparticles onto each other occurs, thereby forming said material having the increased electrical conductivity.

38. Sintering method, in which:
a particle material, containing conductive or semiconductive encapsulated nanoparticles is sintered to join a plurality of said conductive or semiconductive nanoparticles onto each other, thereby increasing the electrical conductivity of said particle material,
wherein said encapsulated nanoparticles in said particle material are arranged as a layer on an insulating substrate, and
wherein
the sintering is performed by applying a voltage over the layer of the particle material containing said encapsulated nanoparticles, such that the encapsulation of said nanoparticles is melted and said nanoparticles come in contact with each other and are sintered, thereby forming a portion in the layer of particle material having an electrical conductivity that is higher than the electrical conductivity of said layer of particle material, and
after removal of said voltage, said portion remains on said insulating substrate.

\* \* \* \* \*